(12) United States Patent
Xiao et al.

(10) Patent No.: US 8,354,721 B2
(45) Date of Patent: *Jan. 15, 2013

(54) GATE-ALL-AROUND CMOSFET DEVICES

(75) Inventors: Deyuan Xiao, Shanghai (CN); Xi Wang, Shanghai (CN)

(73) Assignee: Shanghai Institute of Microsystem and Information Technology, Chinese Academy of Sciences, Changning District Shanghai (CN)

( * ) Notice: Subject to any disclaimer, the term of this patent is extended or adjusted under 35 U.S.C. 154(b) by 116 days.

This patent is subject to a terminal disclaimer.

(21) Appl. No.: 12/810,578

(22) PCT Filed: Feb. 11, 2010

(86) PCT No.: PCT/CN2010/070633
§ 371 (c)(1),
(2), (4) Date: Jun. 25, 2010

(87) PCT Pub. No.: WO2011/097802
PCT Pub. Date: Aug. 18, 2011

(65) Prior Publication Data
US 2011/0254058 A1    Oct. 20, 2011

(51) Int. Cl.
*H01L 27/092* (2006.01)
*H01L 21/84* (2006.01)
*H01L 27/12* (2006.01)

(52) U.S. Cl. .................................. 257/351; 257/369
(58) Field of Classification Search ................ 257/369, 257/E27.062, 384, 341, 335, 327, 288, 213
See application file for complete search history.

(56) References Cited

U.S. PATENT DOCUMENTS

| | | | |
|---|---|---|---|
| 7,838,942 B2 * | 11/2010 | Dennard et al. | 257/365 |
| 2008/0173944 A1 * | 7/2008 | Coronel et al. | 257/351 |
| 2010/0207172 A1 * | 8/2010 | Masuoka et al. | 257/255 |
| 2011/0254013 A1 * | 10/2011 | Xiao et al. | 257/76 |
| 2011/0254099 A1 * | 10/2011 | Xiao et al. | 257/369 |

* cited by examiner

*Primary Examiner* — Olik Chaudhuri
*Assistant Examiner* — Wilner Jean Baptiste
(74) *Attorney, Agent, or Firm* — Global IP Services; Tianhua Gu

(57) ABSTRACT

A GAA (Gate-All-Around) CMOSFET device includes a semiconductor substrate, a PMOS region having a first channel, an NMOS region having a second channel and a gate region. The surfaces of the first channel and the second channel are substantially surrounded by the gate region. A buried insulation layer is disposed between the PMOS region and the NMOS region and between the PMOS or NMOS region and the semiconductor substrate to isolate them from one another. The structure is simple, compact and highly integrated, has high carrier mobility, and avoids polysilicon gate depletion and short channel effect.

20 Claims, 9 Drawing Sheets

GATE-ALL-AROUND CMOSFET DEVICES

BACKGROUND OF THE INVENTION

1. Technical Field

The present invention relates generally to the field of semiconductor manufacturing technologies and more particularly to GAA (Gate-All-Around) CMOSFET (Complementary Metal Oxide Semiconductor Field Effect Transistor) devices.

2. Description of Related Art

A CMOS device integrates both NMOS (N-type Metal Oxide Semiconductor) and PMOS (P-type Metal Oxide Semiconductor) transistors in one device. As the device size continues to shrink, a major challenge in scaling down the channel length is to maintain a high current drive capability ($I_{on}$) and a good stable threshold voltage, and control the device leakage current ($I_{off}$) within requirement. The short-channel effect degrades device performance and is a severe obstacle to scale down conventional planar CMOS devices.

For nanometer-scale channel length CMOS devices, it is important to control the channel conductance mainly through a gate electric field without being affected by a drain scattering electric field. For SOI devices, the above-described problem is alleviated with the reduced silicon thickness in both partial-depletion and full-depletion structures. Compared with the conventional planar CMOS devices, inversion mode dual-gate or tri-gate fin-type FETs have better gate control and scaling down capabilities. Besides operating in an inversion mode, ultra-thin SOI devices can operate in an accumulation mode. Comparing to the full-depletion FET, in an accumulation mode, current flows through the whole SOI device, which increases the carrier mobility, reduces low-frequency noises, lowers the short channel effect, and increases the threshold voltage so as to avoid polysilicon gate depletion effect. In an inversion mode FET, the type of impurities doped in the source and drain regions is different from that in the channel region, the conductive carriers are of minority carriers, and p-n junctions are formed between the source region and the channel region and between the drain region and the channel region, respectively. The inversion mode FETs are currently the most widely used devices. On the other hand, in an accumulation mode FET, the source and drain regions are doped with impurities of the same type as that in the channel region, the conductive carriers is of majority carriers, and there is no p-n junction. Since the carrier mobility is the bulk material mobility, the accumulation mode FET achieves high carrier mobility.

Further, in Si(110) substrates, current flows along <110>crystal orientation, hole mobility is more than doubled compared with in conventional Si(100) substrates, and electron mobility is the highest in Si(100) substrates. To fully utilize the advantage of the carrier mobility depending on crystalline orientation, M. Yang et al. at IBM developed a CMOS fabricating technology on hybrid substrates with different crystal orientations ('High performance CMOS fabricated on hybrid substrate with different crystal orientations', Digest of Technical Paper of International Electron Devices Meeting, 2003). Through bonding and selective epitaxy growth techniques, an NMOS device is fabricated on a Si (100) surface and a PMOS device is fabricated on a Si (110) surface. The paper reported the drive current of the PMOS device on the Si(110) substrate increases by 45%, when $I_{off}$=100 nA/μm. But the PMOS device is fabricated on an epitaxy layer and does not have a buried oxide layer to isolate it from the substrate, thus adversely affecting the performance of the device performance.

Therefore, the present invention provides gate-all-around CMOSFET devices to overcome the above-described problems.

SUMMARY OF THE INVENTION

The present invention provides a gate-all-around CMOSFET device, which includes a semiconductor substrate, a PMOS region having a first channel, an NMOS region having a second channel, and a gate region, wherein the NMOS region is disposed above the semiconductor substrate and the PMOS region is disposed above the NMOS region. The NMOS region and the PMOS region each includes a source region and a drain region located at the two opposite ends of the channel thereof. The surfaces of the first channel and the second channel are substantially surrounded by the gate region. A first buried insulation layer is disposed between the PMOS region and the NMOS region; and a second buried insulation layer is disposed between the NMOS region and the semiconductor substrate. The PMOS region is formed of Si(110), and the NMOS region is formed of Si(100).

In another embodiment of the present invention, a gate-all-around CMOSFET device includes a semiconductor substrate, a PMOS region having a first channel and disposed above the semiconductor substrate, an NMOS region having a second channel and disposed above the PMOS region, and a gate region. The PMOS region and the NMOS region each includes a source region and a drain region located at the two opposite ends of the channel thereof. The surfaces of the first channel and the second channel are substantially surrounded by the gate region. A first buried insulation layer is disposed between the NMOS region and the PMOS region; and a second buried insulation layer is disposed between the PMOS region and the semiconductor substrate. The PMOS region is formed of Si(110), and the NMOS region is formed of Si(100).

The device structure of the present invention is simple, compact and highly integrated. The buried insulation layers efficiently avoid inter-region interference and reduce leakage current such that the devices achieve better performance and better scaling down capability. Therefore, the GAA CMOSFET devices have high carrier mobility and reduced low-frequency noise, and prevent polysilicon gate depletion and short-channel effects.

BRIEF DESCRIPTION OF DRAWINGS

FIGS. 1a-1c show the structure of a GAA CMOSFET device according to a first embodiment of the present invention, wherein FIG. 1a is a top view of the structure; FIG. 1b is a cross-sectional view along a line XX' in FIG. 1a; and FIG. 1C is a cross-sectional view along a line ZZ' in FIG. 1a;

FIGS. 2a-2c show the structure of a GAA CMOSFET device according to a third embodiment of the present invention, wherein FIG. 2a is a top view of the structure; FIG. 2b is a cross-sectional view along a line XX' in FIG. 2a; and FIG. 2C is a cross-sectional view along a line ZZ' in FIG. 2a;

DETAILED DESCRIPTION OF PREFERRED EMBODIMENTS

The following illustrative embodiments are provided to illustrate the disclosures of the present invention. It should be noted that figures are schematic representations of devices, and not drawn to scale.

First Embodiment

Figure 1A:
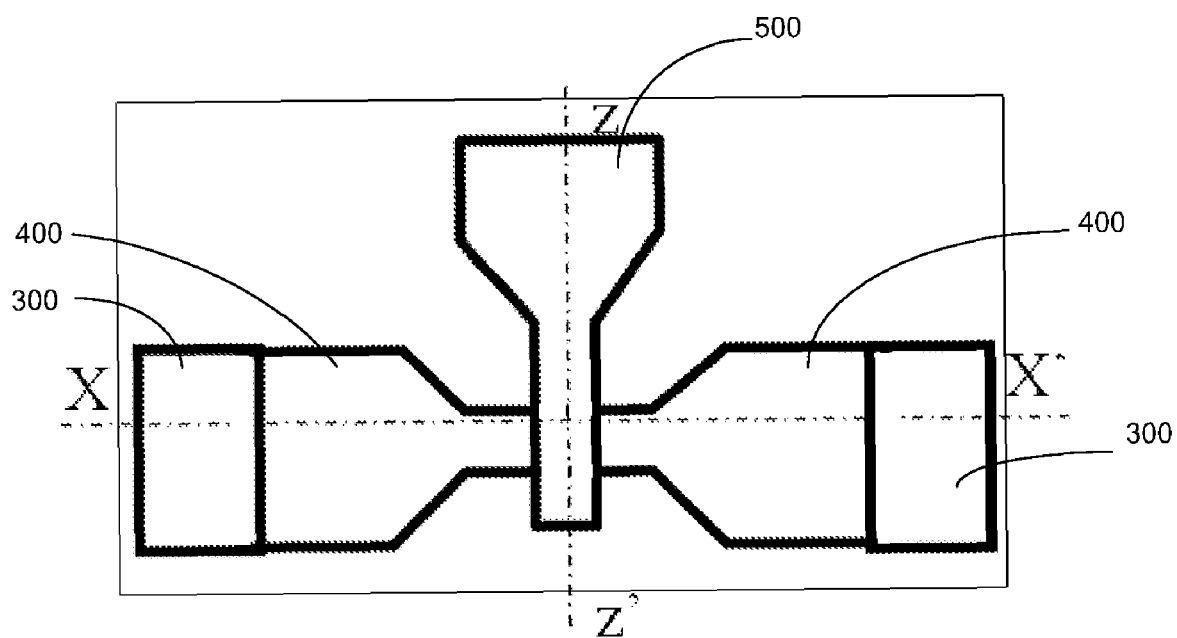
Figure 1B:
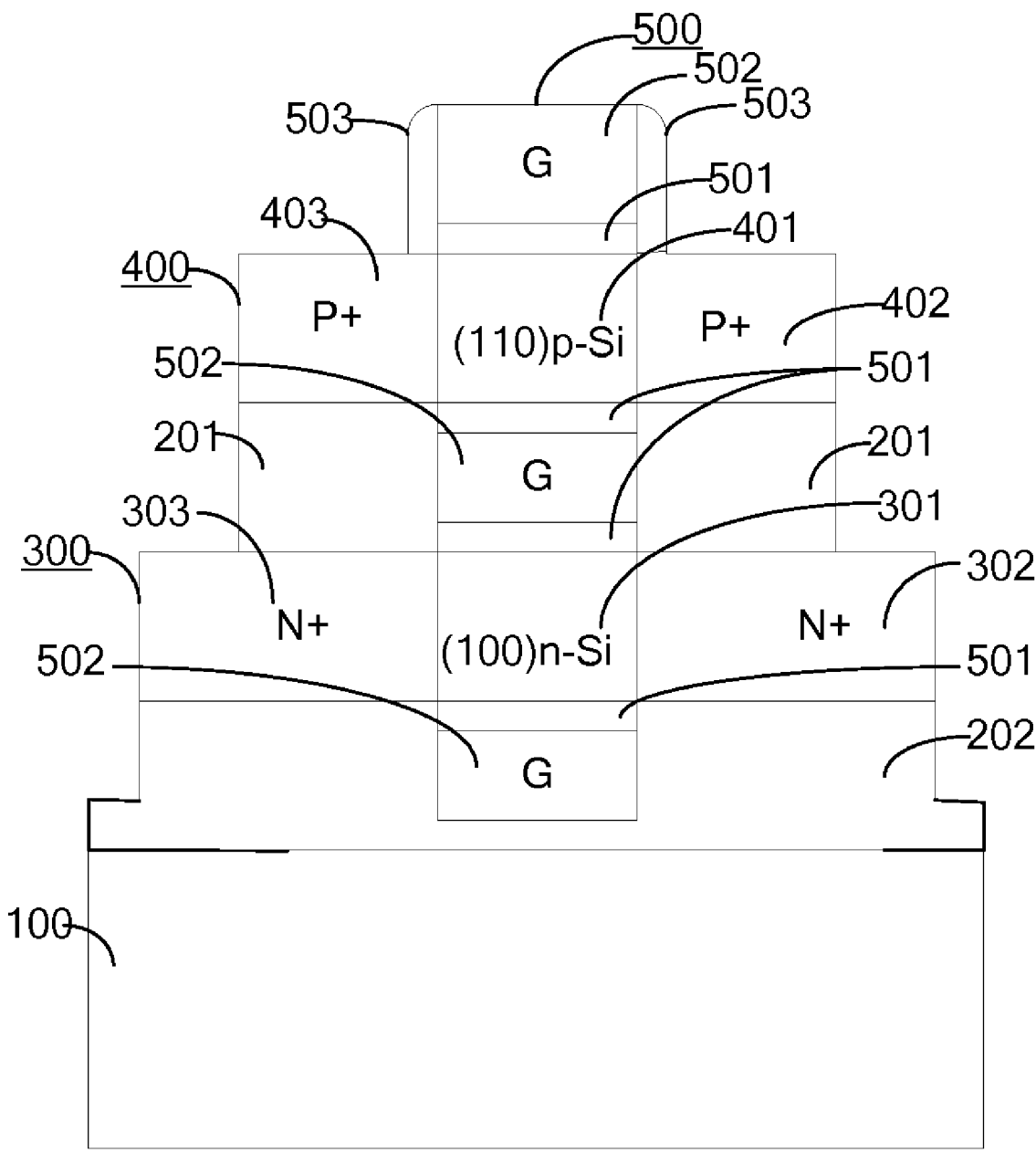
Figure 1C:
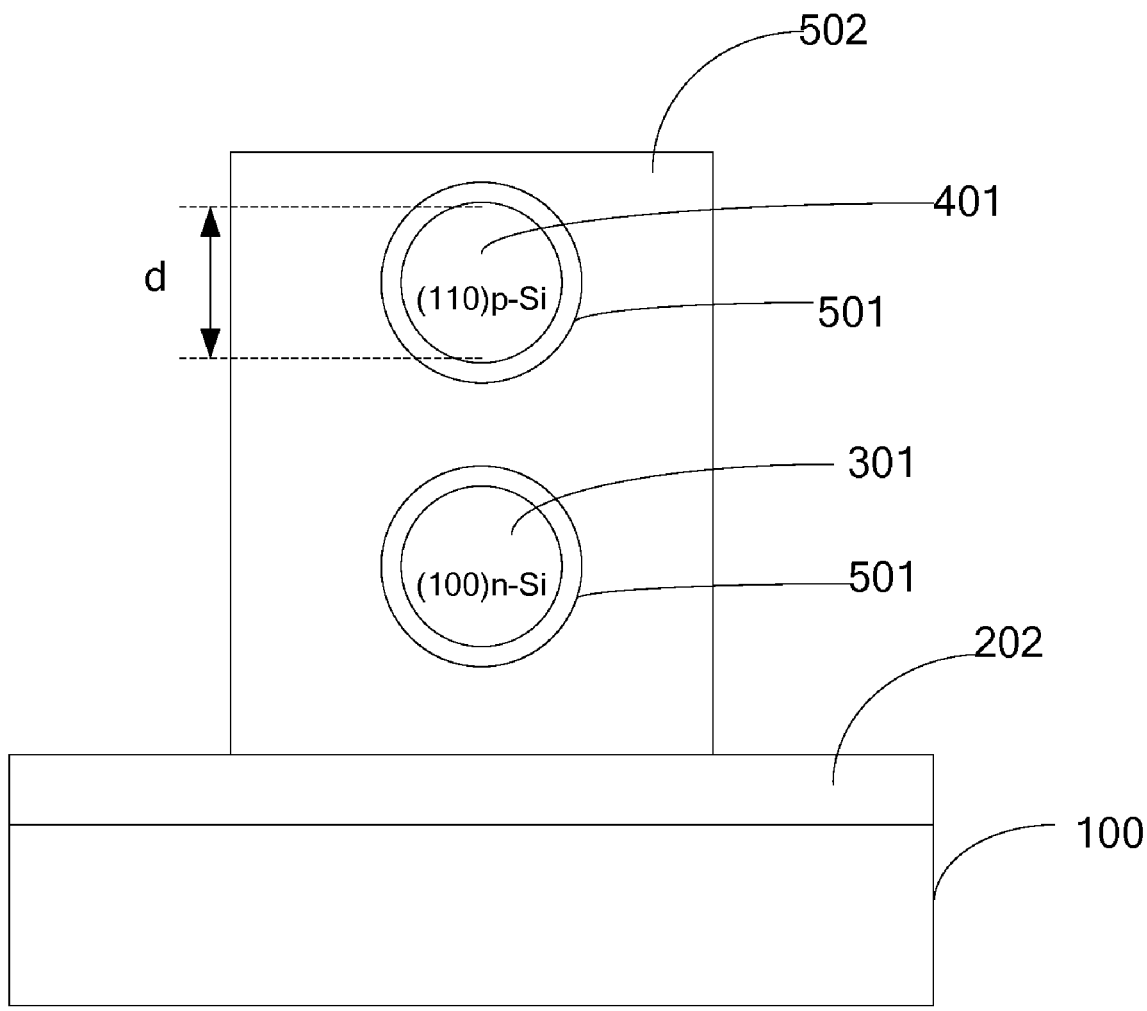

Referring to FIGS. 1a-1c, an accumulation mode GAA CMOSFET of the first embodiment includes: a semiconductor substrate 100, an NMOS region 300 having a second channel 301 and disposed above the semiconductor substrate 100, a PMOS region 400 having a first channel 401 and disposed above the NMOS region 300, and a gate region 500. The PMOS region 400 comprises a source region 403 and a drain region 402 located at the opposite ends of the channel 401. The NMOS region 300 comprises a source region 303 and a drain region 302 located at the opposite ends of the channel 301. Each of the channels 401, 301 has a substantially circular-shaped cross section. Preferably, each of the channels 401, 301 has a cylindrical shape. The channel 401 is preferably formed of p-type Si(110) and the second channel 301 is preferably formed of n-type Si(100). The gate region 500 substantially surrounds the surfaces of the channels 401, 301. A first buried insulation layer 201 is disposed between the PMOS region 400 and the NMOS region 300, other than the gate region 500, to avoid inter-region interference. A second buried insulation layer 202 is disposed between the NMOS region 300 and the underlying semiconductor substrate 100, other than the gate region 500, to isolate the NMOS region 300 from the semiconductor substrate 100. The buried insulation layers effectively reduce the leakage current and improve the device performance. The source region 403 and the drain region 402 of the PMOS region 400 are preferably formed of heavily doped p-type Si(110), and the source region 303 and the drain region 302 of the NMOS region 300 are preferably formed of heavily doped n-type Si(100).

As shown in FIG. 1a, the length of the source region 303 and the drain region 302 along the channel direction XX' is greater than that of the source region 403 and the drain region 402, respectively, so that the electrodes from the source region 303 and the drain region 302 can be led out The width of the source and drain regions perpendicular to the channel direction XX' is greater than the width of the channel, that is, both the PMOS region 400 and the NMOS region 300 are of a fin shape, which is narrow at the center and wide at the ends.

Referring to FIGS. 1b and 1c, the gate region 500 includes: a gate dielectric layer 501 substantially surrounding the surfaces of the channels 401, 301, and a gate electrode material layer 502 substantially surrounding the gate dielectric layer 501. Therein, the gate electrode material layer 502 is selected from the group consisting of titanium, nickel, tantalum, tungsten, tantalum nitride, tungsten nitride, titanium nitride, titanium silicide, tungsten silicide, nickel silicide, and a combination thereof; the gate dielectric layer 501 is formed of an insulating dielectric material comprising silicon dioxide, silicon oxynitride, silicon oxycarbide or a hafnium-based high-k material. Further, the underlying substrate 100 is formed of a semiconductor material such as Si, Ge, Ga and In.

Figure 1D:
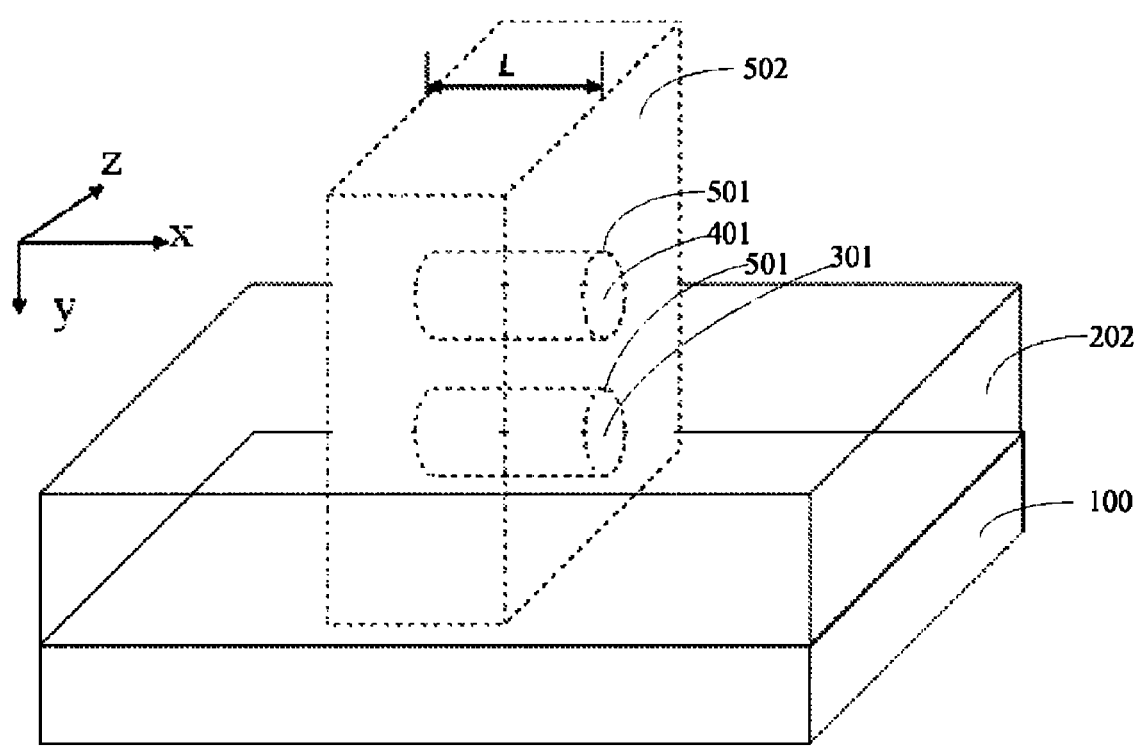
FIG. 1d is a perspective view of the structure of a GAA CMOSFET device according to the first embodiment of the present invention.

Referring to FIGS. 1c and 1d, the channels 401, 301 each has a length L in the range of 10-50_nm, the cross section thereof have a diameter d in the range of 10-80_nm. The first buried insulation layer 201 and the second buried insulation layer 202 each has a thickness in the range of 10-200_nm and is formed of silicon dioxide.

Figure 1E:
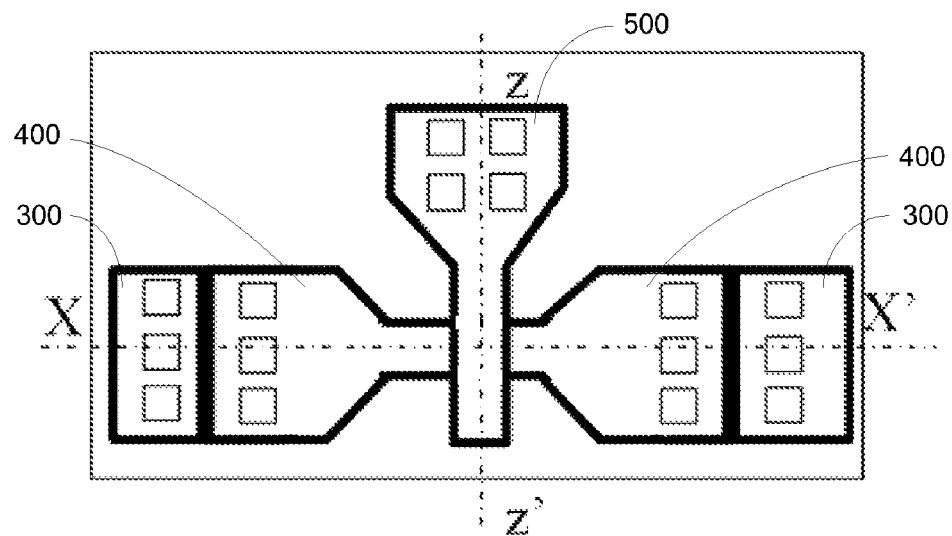
FIG. 1e is a top view of a finished GAA CMOSFET device according to the first embodiment of the present invention.
Figure 1F:
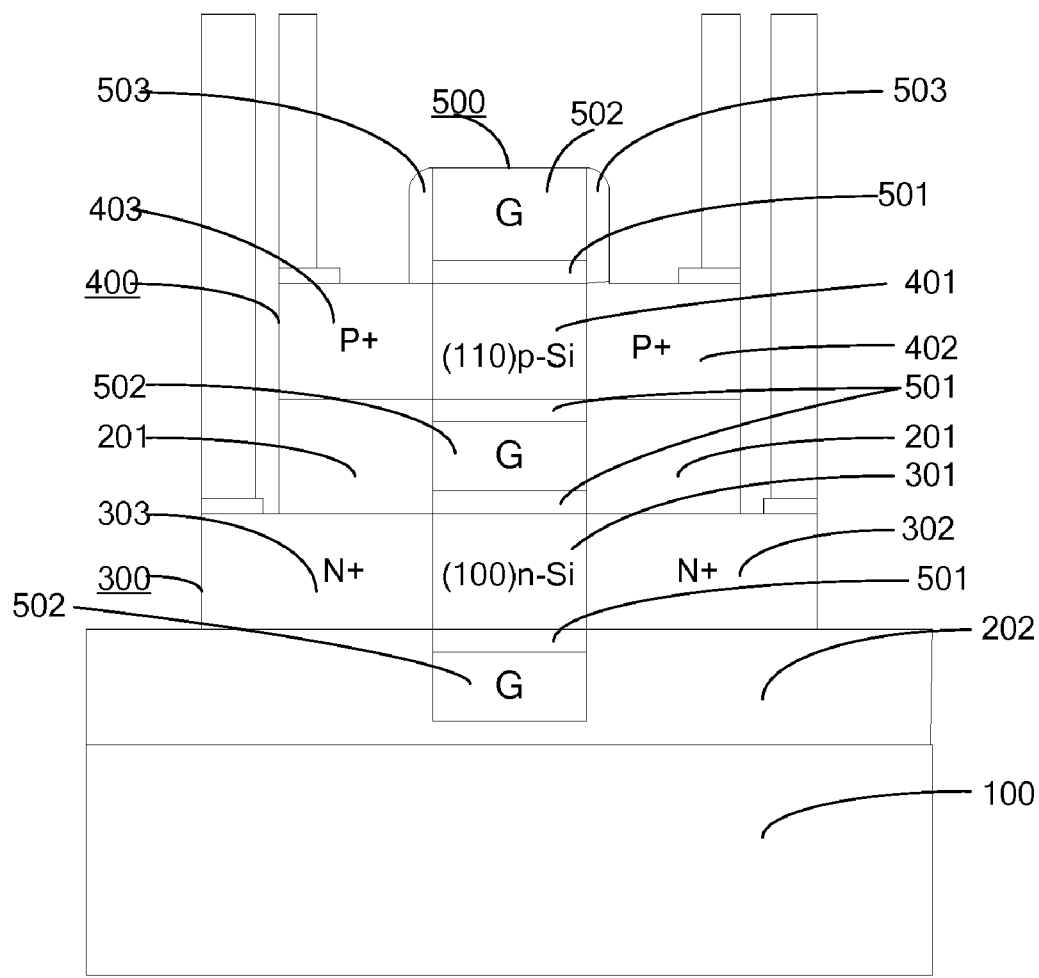
FIG. 1f is a cross-sectional view along a line XX' in FIG. 1e.

The CMOSFET device of the present invention can be fabricated with conventional planar CMOS technologies. First, a SOI substrate with a Si(100) layer and a Si(110) layer is provided, and n-type channel ion implantation and p-type channel ion implantation are performed to the Si(100) layer and the Si(110) layer, respectively; then, lithography and dry etching processes are performed such that a fin-shaped active area is formed in the Si(100) layer and the Si(110) layer, and the narrow portions of the fin-shaped active areas function as an n-type channel and a p-type channel, respectively; thereafter, a buffer oxide etchant is used to selectively etch away the buried oxide layers under the narrow portions so as to form tunnels under the channels, and a high-temperature annealing treatment in hydrogen atmosphere is performed to partially melt the narrow portions, as such, the surface tension causes the cross section of the channels to change from a rectangular shape to a circular shape, i.e., the channels obtain a cylindrical shape; then, a low-pressure chemical vapor deposition or atomic layer deposition (ALD) is performed to grow a gate dielectric layer that surrounds the surfaces of the channels, respectively, and a gate electrode material layer is deposited on the gate dielectric layer, and then, lithography and dry etching processes are performed to form a gate electrode; thereafter, source and drain regions for both of the NMOS and PMOS devices are formed by self-aligned ion implantations; then, the lower layer of the source and drain regions are exposed through lithography and dry etching processes such that source and drain electrode contacts can be fabricated therein. Finally, a CMOSFET device is finished based on the above structure. FIG. 1e is a top view of the device and FIG. 1f is a cross-sectional view of the device. To optimize the device performance, dielectric spacers 503 are disposed at the two sides of the gate, and the spacers can be made of silicon dioxide or silicon nitride.

In order to further analyze the device performance, a 3D simulation adopting a precise hydraulic model and a quantum mechanical density gradient model and applying a mobility degradation model related to doping and surface roughness is established. According to the simulation results, since current flows through the overall cylindrical-shaped channels, the accumulation mode GAA CMOSFET of the present invention achieves high carrier mobility, reduces low-frequency noise, prevents polysilicon gate depletion and short-channel effects, and increases the threshold voltage of the device. The $I_{on}/I_{off}$ ratio of the device can be larger than $10^6$. Therefore, the GAA CMOSFET device of the present invention has better performance and scaling down capability compared with the conventional multi-gate FinFETs.

Second Embodiment

The second embodiment discloses an inversion mode GAA CMOSFET device. Different from the first embodiment, the first channel of the second embodiment is preferably formed of n-type Si(110) and the second channel is preferably formed of p-type Si(100).

The device characteristics have also been simulated and analyzed. The results show that the inversion mode GAA CMOSFET of the second embodiment also achieves high carrier mobility, reduces low-frequency noise, and prevents polysilicon gate depletion and short-channel effects.

Third Embodiment

Figure 2A:
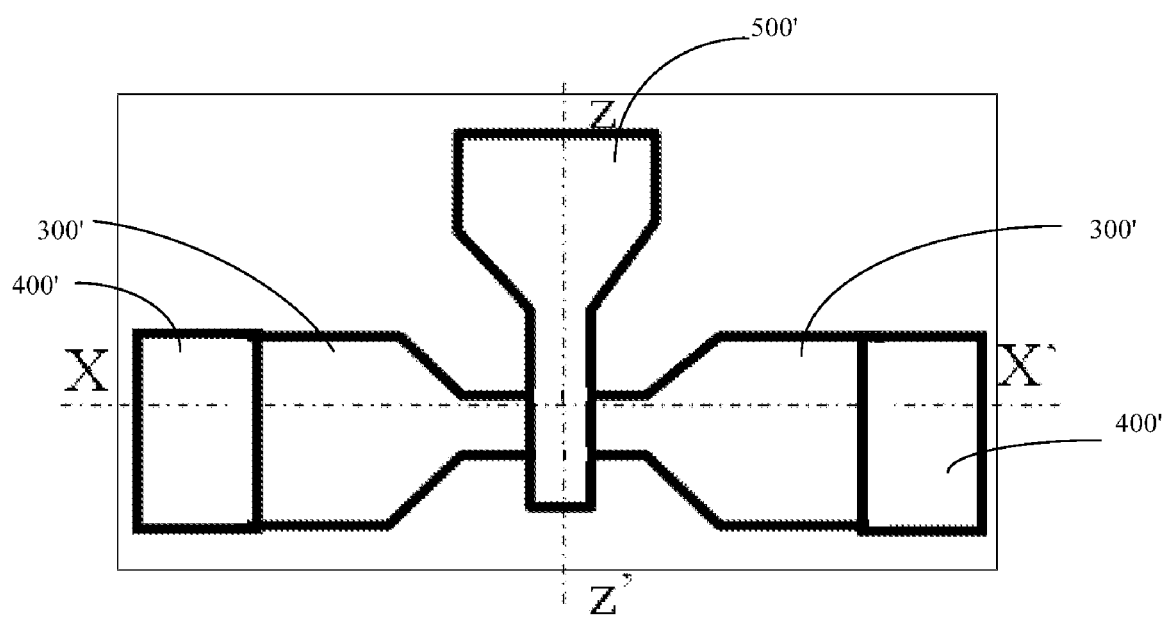
Figure 2B:
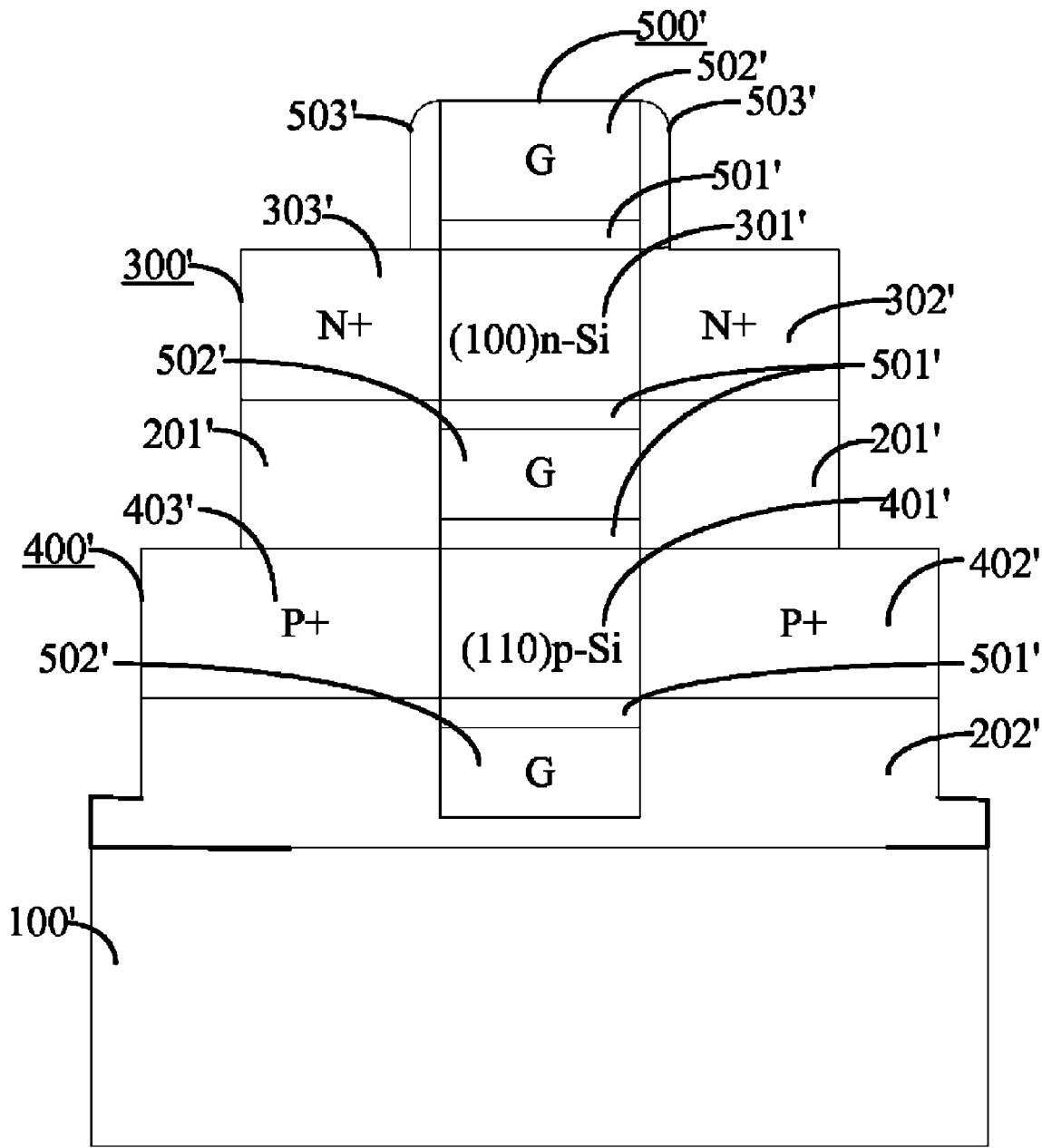
Figure 2C:
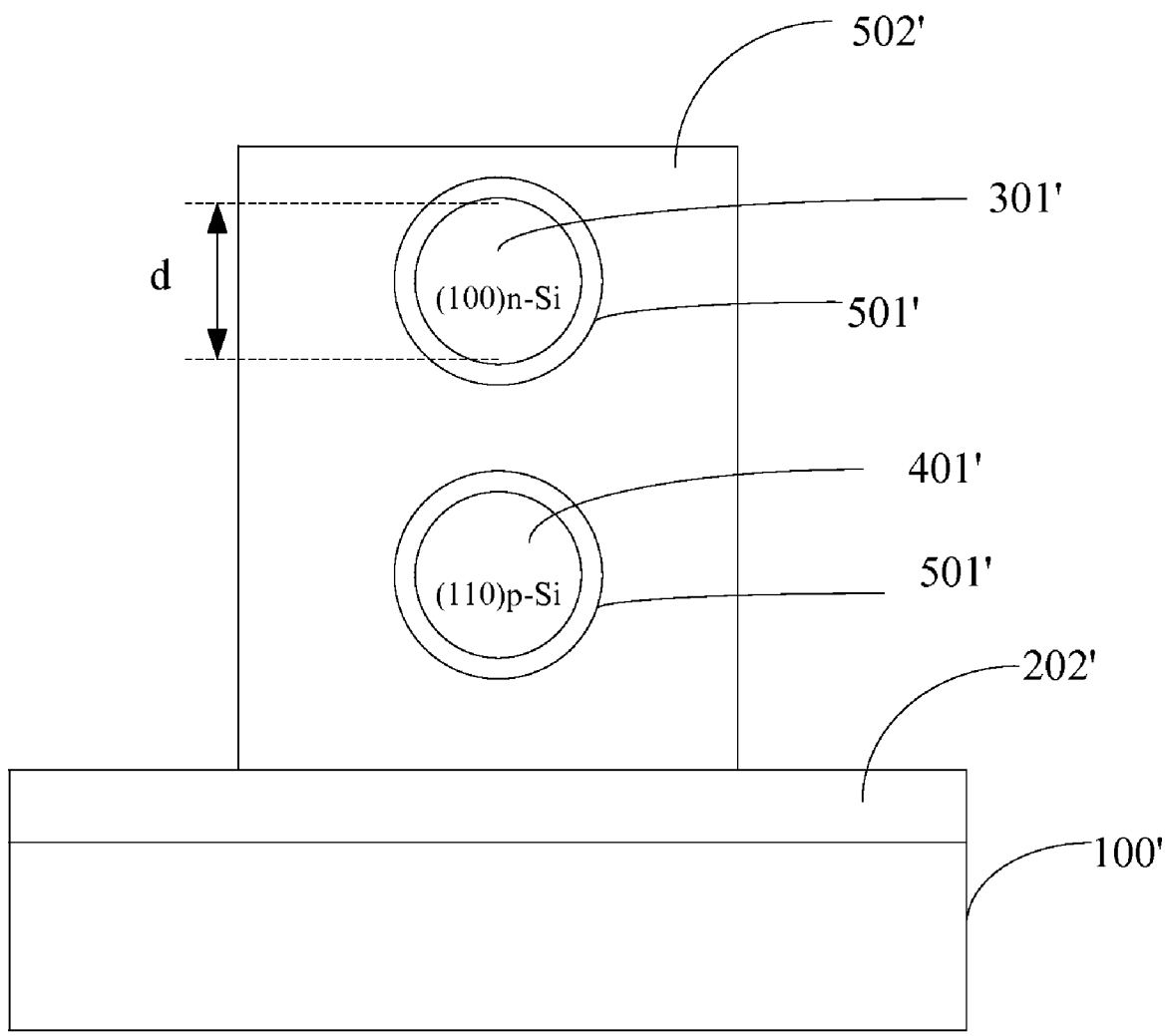

FIGS. 2a-2c show another accumulation mode GAA CMOSFET device, which includes: a semiconductor substrate 100', a PMOS region 400' having a first channel 401' and disposed above the semiconductor substrate 100', an NMOS region 300' having a second channel 301' and disposed above the PMOS region 400', and a gate region 500'. The PMOS region 400' comprises a source region 403' and a drain region 402' located at the opposite ends of the channel 401'. The NMOS region 300' comprises a source region 303' and a drain region 302' located at the opposite ends of the channel 301'. Each of the channels 401', 301' has a substantially circular-shaped cross section, that is, each of the channels 401' and 301' has a cylindrical shape. The channel 401' is preferably formed of p-type Si(110) and the second channel 301' is preferably formed of n-type Si(100). The gate region 500' substantially surrounds the surfaces of the channels 401', 301'. A first buried insulation layer 201' is disposed between the PMOS region 400' and the NMOS region 300', other than the gate region 500', to avoid inter-region interference. A second buried insulation layer 202' is disposed between the PMOS region 400' and the underlying semiconductor substrate 100', other than the gate region 500', to isolate the PMOS region 400' from the semiconductor substrate 100'. The buried insulation layers effectively reduce the leakage current and improve the device performance. The source region 403' and the drain region 402' of the PMOS region 400' are formed of heavily doped p-type Si(110), and the source region 303' and the drain region 302' of the NMOS region 300' are formed of heavily doped n-type Si(100).

As shown in FIG. 2a, the length of the source region 403' and the drain region 402' along the channel direction XX' is greater than that of the source region 303' and the drain region 302', respectively, so that the electrodes from the source region 403' and the drain region 402' can be led out. The width of the source and drain regions perpendicular to the channel direction XX' is greater than the width of the channel, that is, both the PMOS region 400' and the NMOS region 300' are of a fin shape, which is narrow at the center and wide at the ends.

Referring to FIGS. 2b and 2c, the gate region 500' includes: a gate dielectric layer 501' substantially surrounding the surfaces of the channels 401', 301', and a gate electrode material layer 502' substantially surrounding the gate dielectric layer 501'. Therein, the gate electrode material layer 502' is selected from the group consisting of titanium, nickel, tantalum, tungsten, tantalum nitride, tungsten nitride, titanium nitride, titanium silicide, tungsten silicide, nickel silicide, and a combination thereof; the gate dielectric layer 502' is formed of an insulating dielectric material comprising silicon dioxide, silicon oxynitride, silicon oxycarbide or a hafnium-based high-k material. Further, the underlying substrate 100' is formed of a semiconductor material such as Si, Ge, Ga and In.

Different from the first embodiment, the present embodiment has the NMOS region 300' on top and the PMOS region 400' close to the substrate 100'.

Figure 2D:
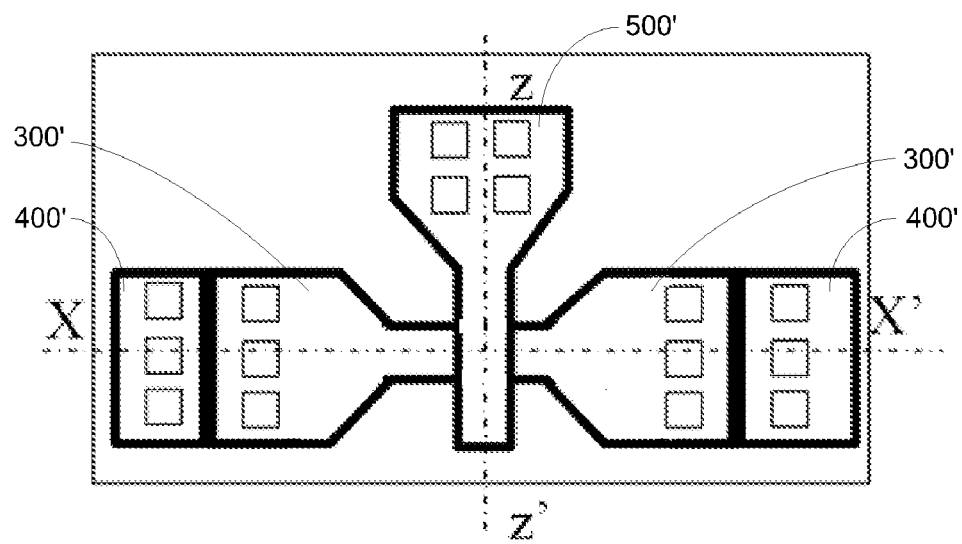
FIG. 2d is a top view of a finished GAA CMOSFET device according to the third embodiment of the present invention.
Figure 2E:
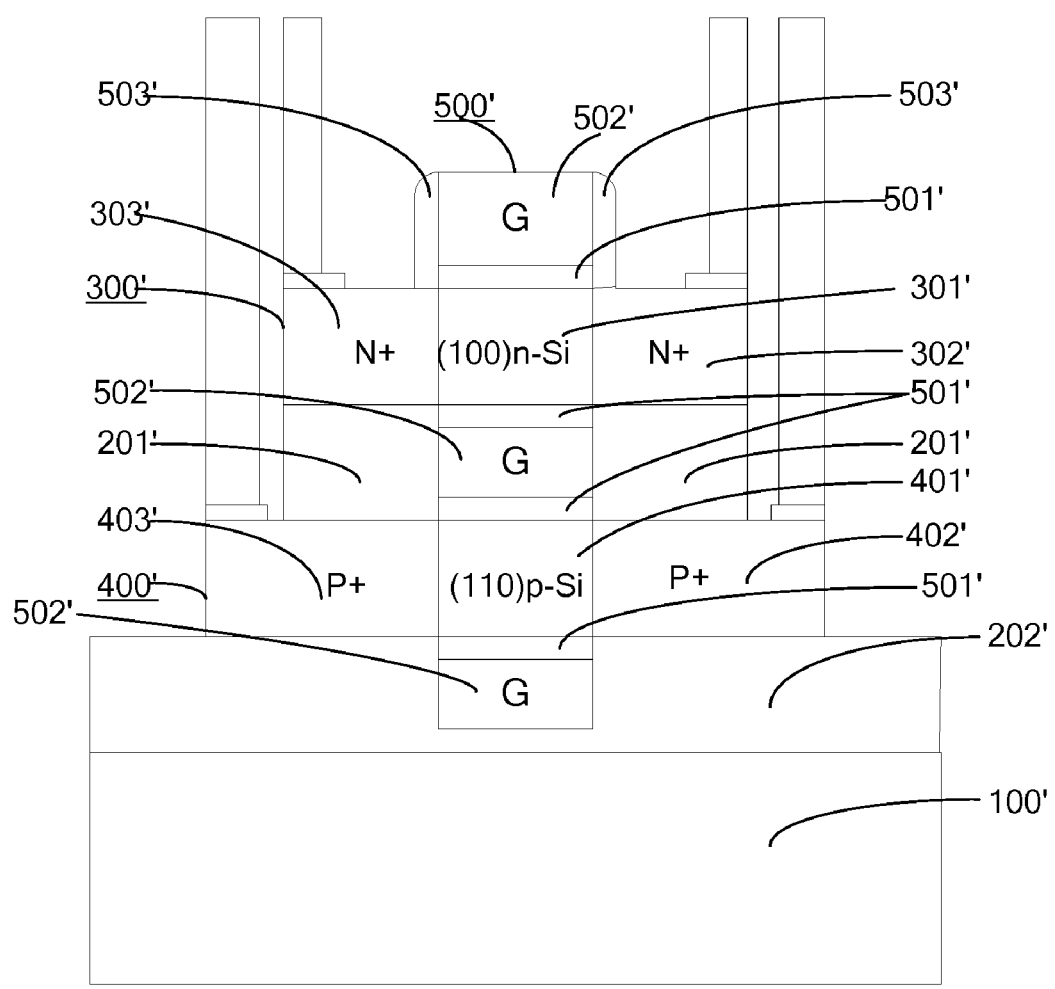
FIG. 2e is a cross-sectional view along a line XX' in FIG. 2d.

A FET device is finished based on the structure of FIGS. 2a-2c. FIG. 2d is a top view of the device and FIG. 2e is a cross-sectional view of the device. To optimize the device performance, dielectric spacers 503' are disposed at the two sides of the gate, and the spacers can be made of silicon dioxide or silicon nitride.

Fourth Embodiment

The fourth embodiment discloses another GAA CMOSFET device in inversion mode. Different from the third embodiment, the first channel of the fourth embodiment is preferably formed of n-type Si(110) and the second channel is preferably formed of p-type Si(100).

The above description of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A Gate-All-Around CMOSFET (Complementary Metal Oxide Semiconductor Field Effect Transistor) device comprising a semiconductor substrate, a PMOS region having a first channel, an NMOS region having a second channel, and a gate region, wherein the NMOS region is stacked above the semiconductor substrate, and the PMOS region is stacked above the NMOS region, wherein
    the NMOS region and the PMOS region each comprises a source region and a drain region located at the two opposite ends of the channel respectively thereof;
        each of the first channel and the second channel is parallel to the semiconductor substrate, and the first channel is stacked up above the second channel;
    the surfaces of the first channel and the second channel are substantially surrounded by the gate region;
    a first buried insulation layer is disposed between the PMOS region and the NMOS region other than the gate region; and
    a second buried insulation layer is disposed between the NMOS region and the semiconductor substrate other than the gate region.

2. The CMOSFET device of claim 1, wherein the first channel is formed of p-type Si(110) and the second channel is formed of n-type Si(100).

3. The CMOSFET device of claim 1, wherein the first channel is formed of n-type Si(110) and the second channel is formed of p-type Si(100).

4. The CMOSFET device of claim 1, wherein the source region and the drain region of the PMOS region are formed of heavily doped p-type Si(110), and the source region and the drain region of the NMOS region are formed of heavily doped n-type Si(100).

5. The CMOSFET device of claim 1, wherein the first channel has a substantially circular-shaped cross section.

6. The CMOSFET device of claim 1, wherein the second channel has a substantially circular-shaped cross section.

7. The CMOSFET device of claim 1, wherein the gate region further comprises: a gate dielectric layer substantially surrounding the surfaces of the first channel and the second channel, and a gate electrode material layer substantially surrounding the gate dielectric layer.

8. The CMOSFET device of claim 7, wherein the gate dielectric layer is selected from the group consisting of silicon dioxide, silicon oxynitride, silicon oxycarbide and a hafnium-based high-k material.

9. The CMOSFET device of claim 7, wherein the gate electrode material layer is selected from the group consisting of titanium, nickel, tantalum, tungsten, tantalum nitride, tungsten nitride, titanium nitride, titanium silicide, tungsten silicide, nickel silicide, and a combination thereof.

10. The CMOSFET device of claim 1, wherein the first buried insulation layer and the second buried insulation layer are formed of silicon dioxide.

11. A Gate-All-Around CMOSFET (Complementary Metal Oxide Semiconductor Field Effect Transistor) device comprising a semiconductor substrate, a PMOS region having a first channel and stacked above the semiconductor substrate, an NMOS region having a second channel and stacked above the PMOS region, and a gate region, wherein the PMOS region and the NMOS region each comprises a source region and a drain region located at the two opposite ends of the channel respectively thereof;

each of the first channel and the second channel is parallel to the semiconductor substrate, and the second channel is stacked up above the first channel;

the surfaces of the first channel and the second channel are substantially surrounded by the gate region;

a first buried insulation layer is disposed between the PMOS region and the NMOS region other than the gate region; and a second buried insulation layer is disposed between the PMOS region and the semiconductor substrate other than the gate region.

12. The CMOSFET device of claim 11, wherein the first channel is formed of p-type Si(110) and the second channel is formed of n-type Si(100).

13. The CMOSFET device of claim 11, wherein the first channel is formed of n-type Si(110) and the second channel is formed of p-type Si(100).

14. The CMOSFET device of claim 11, wherein the source region and the drain region of the PMOS region are formed of heavily doped p-type Si(110), and the source region and the drain region of the NMOS region are formed of heavily doped n-type Si(100).

15. The CMOSFET device of claim 11, wherein the first channel has a substantially circular-shaped cross section.

16. The CMOSFET device of claim 11, wherein the second channel has a substantially circular-shaped cross section.

17. The CMOSFET device of claim 11, wherein the gate region further comprises: a gate dielectric layer substantially surrounding the surfaces of the first channel and the second channel, and a gate electrode material layer substantially surrounding the gate dielectric layer.

18. The CMOSFET device of claim 17, wherein the gate dielectric layer is selected from the group consisting of silicon dioxide, silicon oxynitride, silicon oxycarbide and a hafnium-based high-k material.

19. The CMOSFET device of claim 17, wherein the gate electrode material layer is selected from the group consisting of titanium, nickel, tantalum, tungsten, tantalum nitride, tungsten nitride, titanium nitride, titanium silicide, tungsten silicide, nickel silicide, and a combination thereof.

20. The CMOSFET device of claim 11, wherein the first buried insulation layer and the second buried insulation layer are formed of silicon dioxide.

* * * * *